United States Patent [19]

Felix et al.

[11] Patent Number: 5,684,424

[45] Date of Patent: Nov. 4, 1997

[54] PULSE SKEW CONTROL

[75] Inventors: Stephen Felix, Bristol; Russell Edwin Francis, Wickwar, both of England

[73] Assignee: SGS-Thomson Microelectronics Ltd., Bristol, United Kingdom

[21] Appl. No.: 468,726

[22] Filed: Jun. 6, 1995

[30] Foreign Application Priority Data

Jun. 9, 1994 [GB] United Kingdom .................. 9411602

[51] Int. Cl.$^6$ ..................................................... H03K 3/00
[52] U.S. Cl. ........................ 327/293; 327/176; 327/292
[58] Field of Search ................................. 327/170, 172, 327/175, 176, 131, 132, 134, 135, 336, 337, 77, 76, 291, 293, 295, 269, 292; 325/16

[56] References Cited

U.S. PATENT DOCUMENTS

| 4,404,481 | 9/1983 | Ide et al. | 327/131 |
|---|---|---|---|
| 4,634,984 | 1/1987 | Harwood et al. | 327/174 |
| 4,970,418 | 11/1990 | Masterson | 327/298 |
| 5,045,725 | 9/1991 | Sasaki et al. | 327/292 |
| 5,059,818 | 10/1991 | Witt et al. | 327/291 |
| 5,214,319 | 5/1993 | Abdi | 327/74 |
| 5,336,947 | 8/1994 | Lehning | 327/76 |
| 5,394,020 | 2/1995 | Nienaber | 327/74 |
| 5,396,129 | 3/1995 | Tabira | 327/292 |
| 5,397,943 | 3/1995 | West et al. | 327/292 |
| 5,444,405 | 8/1995 | Truong et al. | 327/293 |
| 5,510,739 | 4/1996 | Caravella et al. | 327/74 |
| 5,528,187 | 6/1996 | Sato et al. | 327/292 |
| 5,554,949 | 9/1996 | Suwald | 327/293 |

FOREIGN PATENT DOCUMENTS

WO 93/18463  9/1993  WIPO.

OTHER PUBLICATIONS

Patent Abstracts of Japan, vol. 17, No. 280 (P-1547) (280) 28 May 1993 & JP-A-05 012 223 Fujitsu Ltd.
Patent Abstracts of Japan, vol. 17, No. 390 (P-1577) (390) 21 Jul. 1993 & JP-A-05 066 851 Fujitsu Ltd.
Patent Abstracts of Japan, vol. 16, No. 547 (P-1452) (547) 17 Nov. 1992 & JP-A-04 205 326 Fujitsu Ltd.

Primary Examiner—Timothy P. Callahan
Assistant Examiner—My-Trang Nu Ton
Attorney, Agent, or Firm—Kenneth C. Hill; Duke W. Yee

[57] ABSTRACT

A pulse generator for use in generating pulses at different locations within a circuit has a first circuit 501 for a time dependent operation after receipt of a first input pulse and a second circuit 502 for carrying out a time dependent operation after receipt of a second input pulse after the first input pulse. A third circuit 503 is responsive to each of the first and second circuits 501, 502 reaching respective predetermined conditions so that an output pulse is produced by the third circuit 503 at a time dependent on the average durations of operation of the first and second circuits 501 and 502.

15 Claims, 6 Drawing Sheets

PULSE SKEW CONTROL

The present invention relates to methods and apparatus for pulse generation and more particularly but not exclusively to methods and apparatus for clock pulse generation.

BACKGROUND OF THE INVENTION

Modern circuit techniques frequently require the provision of clock pulses at a number of different locations within a circuit. Where a circuit is relatively large there may occur substantial propagation delays between the different locations with the effect that a rising edge of a clock pulse of concern may arrive at one location at a significantly different time to the arrival of the edge at another location. This phenomenon is known as "clock skew".

A number of measures are commonly used in the art to reduce clock skew. For example, where the circuit has the form of a system of circuit boards the transmission line delay between and within the boards is minimised. Where the circuit is an integrated circuit, for example in VLSI circuits, engineers minimise the inherent delay of the RC interconnect line. In either situation it is desirable to route clock signals along tree-like interconnect structures having substantially the same pathlength of interconnect between the clock source and every point at which the clock is required. Finally it is desirable to locate the clock source as close as possible to the physical centre of the design so that the clock routing is as short as possible.

Each of these measures introduces additional design constraints into a circuit and these constraints may not be compatible with other requirements for the circuit. For example using the tree like interconnect structure is often difficult to implement and may occupy excessive area. Using low delay interconnect on integrated circuits usually means provision of wider tracks which occupy excessive area and, furthermore, which increase the power required to drive such tracks. Locating the clock source at the physical centre of a design may unduly constrain the designer; moreover in the case of integrated circuits the added complexity engendered by a physically central clock source may be highly undesirable.

The present invention provides embodiments which may be used in reducing clock skew without imposing the above-mentioned constraints.

SUMMARY OF THE INVENTION

Embodiments of the present invention provide a method of generating output pulses at a plurality of points along a delay-inducing path, comprising: applying a pulse to the path, whereby the pulse propagates in a first direction along the path, and then propagates in a second direction along the path, the second direction being opposite to the first direction; receiving, as respective forward pulses, the pulse at each of said plurality of points, while the pulse is propagating in the first direction; receiving, as respective reverse pulses, the pulse at each of said plurality of points while the pulse is propagating in the second direction; and, for each point, applying the respective forward pulse and the respective reverse pulse to a respective pulse generator at that point, for producing a respective output pulse at a desired time.

According to the present invention there is provided a method of producing an output pulse, comprising receiving a first input pulse and starting operation of first circuitry in response thereto, said first circuitry having an output; receiving a second input pulse later than said first input pulse and starting operation of second circuitry in response thereto, said second circuitry having an output; applying the outputs of said first and second circuitry to third circuitry; monitoring the third circuitry for the occurrence of a predetermined condition related to the respected durations of operation of said first and second circuitry; and producing said output pulse in response to the occurrence of said condition, whereby said output pulse occurs at a time determined by the time spacing between said first and said second input pulses.

According to a further aspect of the present invention there is provided a pulse generator having first and second inputs for receiving time-spaced first and second pulses, said second pulse occuring later than said first pulse; first circuitry operable by the first pulse; second circuitry operable by the second pulse; and third circuitry responsive to the respective durations of operation of the first and second circuitry to produce an output pulse at a time determined by the time spacing between said first and second pulses.

Preferably the output pulse is produced it a time dependent on the average duration of operation of the first and second circuitry.

Conveniently the first circuitry has a first current source for producing a predetermined first current, the second circuitry has a second current source for producing a predetermined second current, the first and second current sources being operable in response to first edges of the first and second pulses respectively, and the third circuitry has a first capacitor receiving said first and second currents to be charged thereby, and first comparison circuitry responsive to a voltage across the first capacitor attaining a predetermined level, to produce said output pulse.

Advantageously the pulse generator further comprises a third current source for producing a predetermined third current and a fourth current source for producing a predetermined fourth current, the third and fourth current sources being made operable in response to second edges of the first and second pulses respectively; and a second capacitor receiving the third and fourth currents to be charged thereby, and second comparison circuitry responsive to a voltage across the second capacitor attaining a predetermined level to terminate said output pulse.

Preferably the first and second capacitors have substantially the same value, each current produced by the respective current sources has the same value and the predetermined levels are the same.

Alternatively, the first circuitry comprises first delay circuitry, having said first input at one end thereof whereby in response to application of said first pulse at said one end, the first pulse propagates along the first delay circuitry, said second circuitry comprises second delay circuitry having a second input at one end thereof whereby application of said second pulse to said second input causes said second pulse to propagate along said second delay circuitry, each delay circuitry having a plurality of taps between the respective input and a respective end thereof, and said third circuitry comprises logic circuitry having a first input connected to a tap of the first delay circuitry, a second input connected to a tap of the second delay circuitry and an output for producing said output pulse.

Conveniently each delay line has m taps and a similar number of logic gates are provided, wherein the nth logic gate has a first input connected to the nth tap of the first delay circuitry and a second input connected to the (m-n)th tap of the second delay circuitry.

BRIEF DESCRIPTION OF THE DRAWINGS

In the Figures like reference numerals will be used for like parts.

Figure 1:
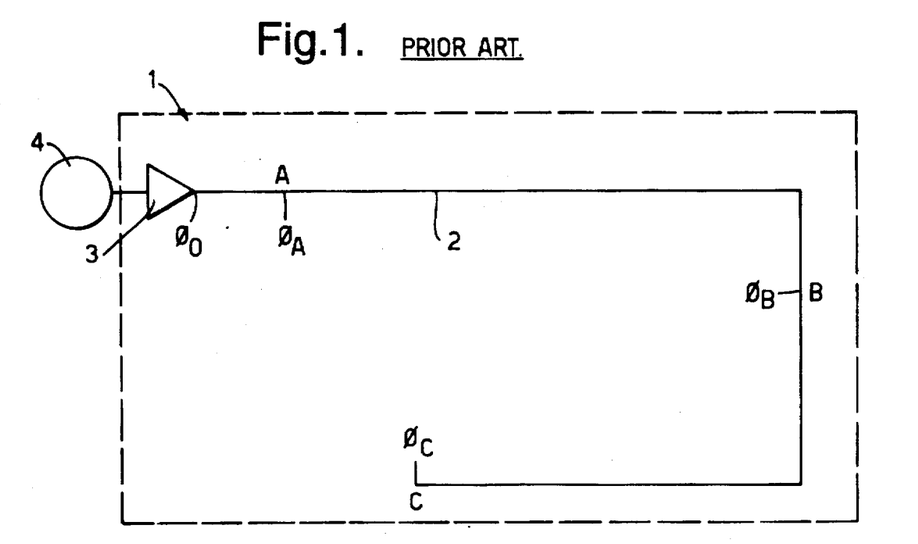
FIG. 1 shows a partial circuit diagram of a clock pulse distribution arrangement of the prior art.

Referring to FIG. 1, an integrated circuit 1 has a path 2 for distribution therealong of clock pulses from an input buffer 3 to various stations A, B, C. The input buffer 3 is supplied from a clock source 4 external to the circuit board 1. The buffer 3 is used to meet any required impedance constraints. At each of the stations A, B, C a clock pulse is input from path 2 and due to different pathlengths between the respective stations and the input buffer the clock pulses arriving at stations A, B, C are time-displaced.

Figure 2:
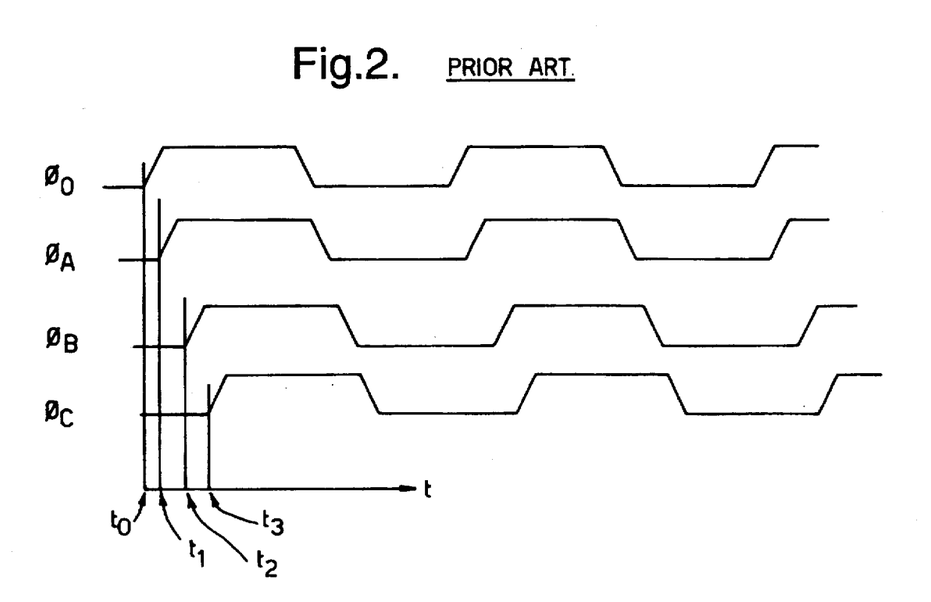
FIG. 2 shows voltage waveforms occurring at various locations on FIG. 1.

This effect is illustrated in FIG. 2, where the rising edge of the clock pulse at the buffer occurs at $t_0$, that at station A occurs at $t_1$, that at station B at $t_2$ and the pulse at station C, at time $t_3$. The waveforms O, OA, OB and OC represent the voltage waveforms at the buffer 3 and stations A, B and C respectively.

DESCRIPTION OF THE PREFERRED EMBODIMENTS

Figure 3:
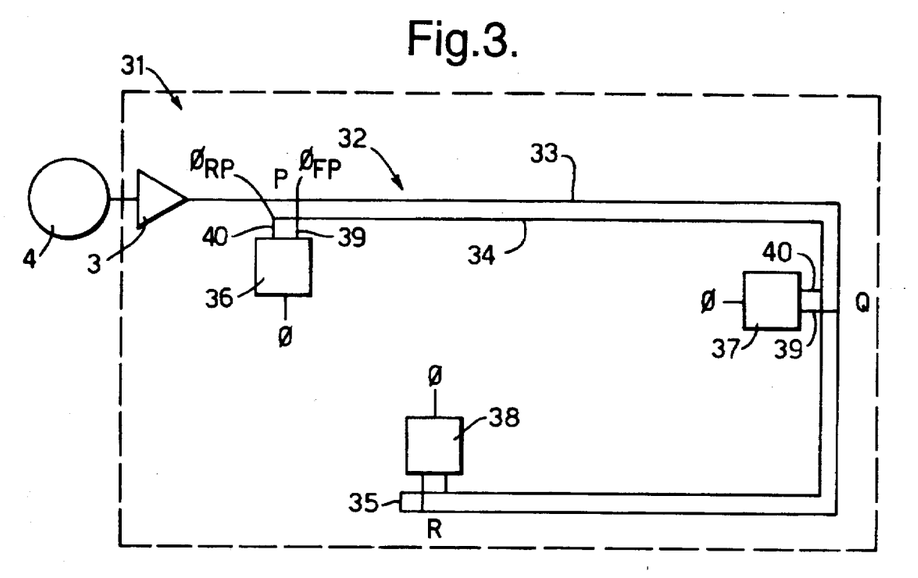
FIG. 3 shows a block diagram of a first embodiment of an apparatus for generating output pulses, in accordance with the invention.

Referring to FIG. 3, an integrated circuit 31 embodying the invention has a clock pulse path 32 fed from an input buffer 3. The path 32 has a first forward portion 33 along which pulses from buffer 3 propagate in a first forward direction and a second reverse portion 34, along which pulses propagate in a second direction, the second direction being opposite to the first direction. As seen in FIG. 3 the reverse path portion 34 is an extension of the forward path portion 33, the two meeting at a path extremity point 35.

Although the reverse path portion 34 is shown as parallel to the forward path portion 33, this is for the purposes of illustration only and any convenient arrangement may be chosen. However, the most convenient form of the invention requires that the pathlength between any two stations along the forward path portion is the same as the pathlength along the reverse path portion between those two stations.

It is also envisaged that path portions 33 and 34 could be provided by a single transmission line, pulses being input at one end of the line and being reflected back from the other end of the line.

The integrated circuit 31 of FIG. 3 has three stations P, Q, R at which clock pulses are required. For this purpose each station P, Q, R has a respective pulse generator 36, 37, 38.

Each of the pulse generators has a first input connected to the forward path portion 33 and a second input connected to the reverse path portion 34. For ease of reference the forward pulse received by pulse generator 36 is referenced as $\phi_{FP}$ and the reverse pulse at pulse generator 36 is referenced as $\phi_{RP}$.

Assuming that the line is symmetrical i.e. the pathlength between any two points is the same for the forward and reverse paths, as described above,—the mid-point between the forward pulse and the reverse pulse at any pulse generator corresponds to the instant at which the pulse travelling along the path 32 reaches the path extremity point 35. Thus if each pulse generator 36–38 responds to the detection of the respective forward pulse for that pulse generator, to the respective reverse pulse for that pulse generator and produces a respective output pulse $\phi$ at the same period after the mid-point between the two pulses, the output pulses will occur globally at the same instant for each pulse generator.

Where the path is not symmetrical—i.e. the pathlength between two points differs between the forward and the reverse direction, it will not be the mid-point between the forward and reverse pulses which determines the instant of arrival of the forward pulse at the path extremity, but some other second point between the two pulses. In this event the pulse generators 36–38 produce their output pulses at a desired time corresponding to a predetermined duration after this second point to produce simultaneous clock pulses.

Figure 4:
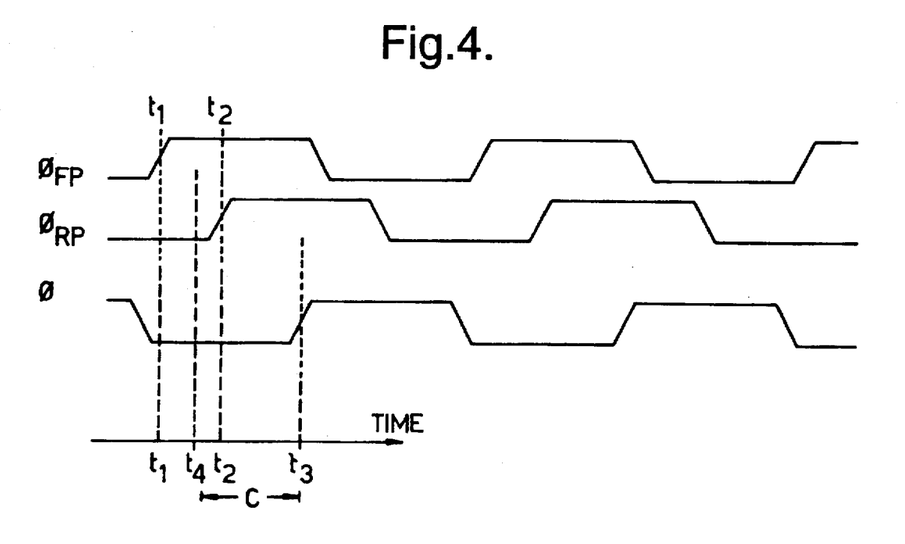
FIG. 4 shows the waveforms at one location on FIG. 3.

Referring now to FIG. 4, the pulse relationship will now be explained. The input pulse train $\phi_{FP}$ to pulse generator 36 has a first rising edge at a time point $t_1$ and the reverse pulse $\phi_{RP}$ has a first rising edge occurring at a time point $t_2$. In the preferred arrangment, with symmetrical forward and reverse paths, the output pulse 0 is generated to have a rising edge occurring at a time $t_3$ which occurs a predetermined time c after the mid-point $t_4$ between times $t_1$ and $t_2$. Normally it is desired to generate clock pulses at the same instant throughout the circuit, in which case for the symmetrical path situation, the time c is the same for all pulse generators 36–38. However if for some reason it were desired to produce pulses at a predetermined separation or skew relative to one another, the time period c could be arranged to differ from pulse generator to pulse generator as desired.

A first embodiment of the pulse generator 36–38 will now be described with reference to FIGS. 5 and 6.

Figure 5:
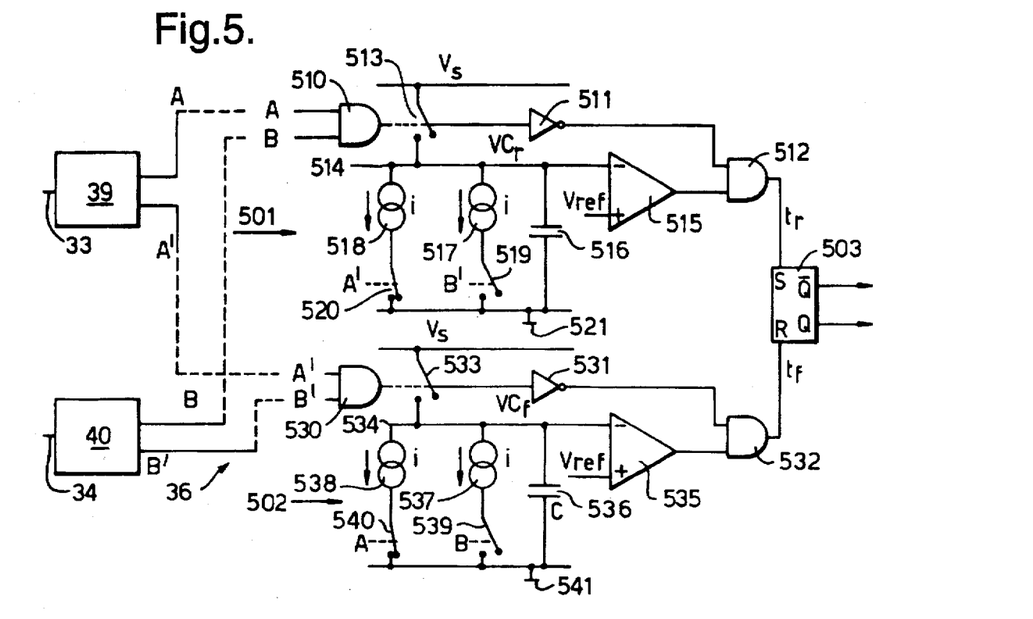
FIG. 5 shows a first embodiment of a pulse generator for use in FIG. 3 in accordance with the invention.

Referring first to FIG. 5 the pulse generator for use in FIG. 3 consists of two similar circuits 501, 502. One circuit 501 reacts to the rising edge of applied clock pulses, and in response thereto sets an R-S flip flop 503, and circuit 502 responses to the falling edge of applied clock pulses and resets the flip flop 503. Each pulse generator has two inputs 39 and 40 connected respectively to the forward and return paths. Each input includes circuitry for generating true and complement values of the voltage values on the forward and return paths.

Circuit 501 consists of a first AND gate 510, to whose inputs are applied a first input A, representing the complement of the forward clock pulse $_{FP}$ and a second input B representing the complement of the reverse clock pulse $\phi_{RP}$. The output of gate 510 is coupled firstly to an inverter 511, whose output provides a first input to a second AND gate 512, and secondly to control a switch 513. Switch 513 is connected between a supply voltage VS and a circuit node 514 for connecting or disconnecting the circuit node to the supply voltage. The circuit node 514 constitutes the inverting input of a comparator 515 and also forms the junction of one pole of a capacitor 516 and one pole of two parallel constant current sources 517, 518. Constant current sources 517 and 518 are connected via respective controllable switches 519 and 520 to a reference node 521, to which is also connected the second pole of the capacitor 516. Thus when switch 519 is conductive the first current source 517 is connected parallel to capacitor 516 and when switch 420 is made conductive current source 518 is connected parallel with capacitor 516. The switch 519 is controlled by a signal B', which corresponds to the true reverse clock pulse, whereas switch 520 is controlled by a signal A' which corresponds to the true value of the forward clock pulse $\phi_{FP}$. A reference voltage $V_{ref}$ is applied to the non-inverting input of comparator 515.

Figure 6:
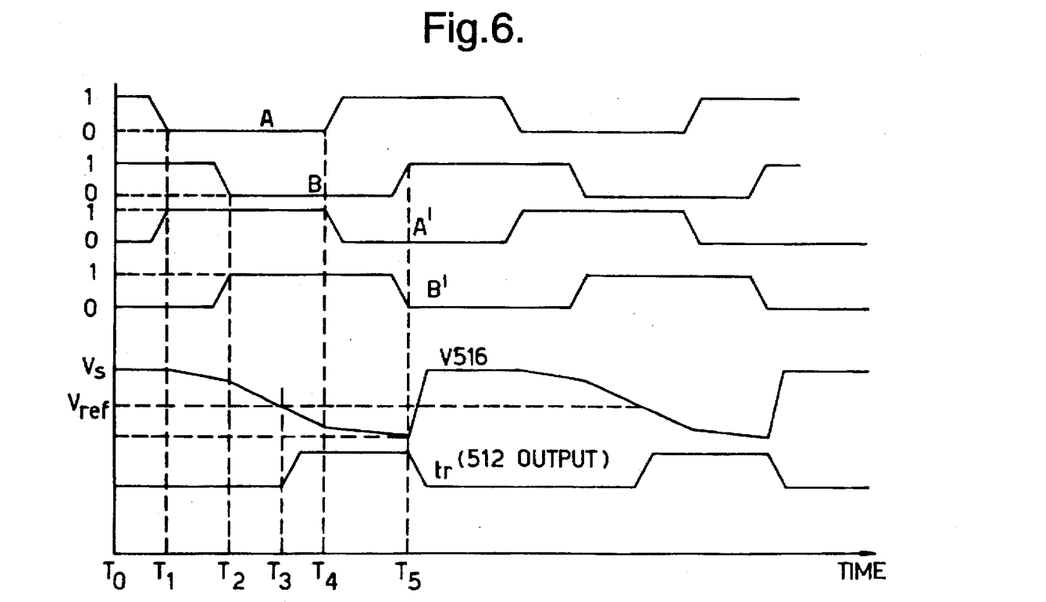
FIG. 6 shows waveforms occurring on the circuit of FIG. 5.

Referring now to FIG. 6, the operation of the circuit shown in FIG. 5 will now be explained.

At the time $T_0$ both of the input pulses A and B are at logical 1. Accordingly the output of AND gate 510 is also at logical 1, thus rendering switch 513 conductive and connecting node 514 to the supply voltage VS. At the same time, the complement of A is at logical 0, as is the complement of B, and thus both switches 519 and 520 are non-conductive. Hence capacitor 516 becomes charged to the supply voltage VS and the output of comparator 515 is low. Thus, at the input to gate 512 there is applied logical 0 from comparator 515 and logical 0 from inverter 511. The output of AND gate 512 is consequentially at logical 0.

At time $T_1$ input A falls to logical 0, and hence A' changes state to logical 1. The output of AND gate 510 goes low, causing switch 513 to become non-conductive, and switch 520 becomes conductive, thus applying current source 518 to discharge capacitor 516. The input to comparator 515 at node 514 remains above the level $V_{ref}$, and the output of the comparator 515 remains low. Inverter 511 now has a logical 0 at its input, and as a result produces logical 1 at its output. AND gate 512 has one input at logical 1 and one input at logical 0 so continuing to produce a logical 0 output.

At time instant $T_2$ input B changes state to logical 0 and input B' to logical 1. As a result AND gate 510 continues to have a logical 0 output, causing switch 513 to remain non-conductive and inverter 511 to continue to have a logical 1 output. Switch 520 remains in the conductive state but switch 519 changes to the conductive state so that both current source 517 and current source 518 are now discharging capacitor 516. Initially node 514 remains above the potential $V_{ref}$ and hence comparator 515 retains its logical 0 output. However, at time $T_3$ the combined effect of the two current sources 517 and 518 has discharged the capacitor 516 until node 514 has the same potential as the non-inverting terminal of comparator 515, at which point the comparator output changes state to logical 1. Consequently the two inputs to AND gate 512 are now at logical 1, which causes the output to change state to logical 1, producing the rising edge of pulse $t_r$. This pulse $t_r$ is applied to the set input of flip flop 503 to produce a positive going edge at the 0 output thereof.

Some time later at time $T_4$ input signal A and its complement A' change state to logical 1 and logical 0 respectively. As a result switch 520 becomes non-conductive. At a yet later time, $T_5$, the other input signal B, and its complement B' change state to logical 1 and logical 0 respectively, whereupon the AND gate 510 once again has two logical 1 inputs, which causes the output to change to logical 1, thus closing switch 513 to become conductive, and terminating output pulse $t_r$, due to the logical 0 from inverter 511 being applied to one input of AND gate 512. The capacitor 516 then starts to recharge towards the supply voltage VS and the cycle may start again.

The second circuit 502 of the pulse generator is similarly constructed to the first circuit. It consists of a third AND gate 530 feeding inverter 531 whose output provides one input to a fourth AND gate 532. The output of third AND gate 530 is connected to a switch 533 which couples the supply voltage VS to a circuit node 534 which forms the inverting input of a comparator 535. A second capacitor 536 is coupled between node 534 and a reference potential 541. Parallel with the capacitor are two series circuits each comprising a current source 537, 538 with a serial switch 539,540.

The second circuit 502 responds to the falling edge of the respective input pulses, and the input signals which are coupled to the respective points are the complements of those which are applied to the corresponding points in the first circuit 501. Thus the AND gate 530 receives input signals A' and B' and the switches 539 and 540 receive signals B and A respectively. The output of the second AND gate 532 is connected to the reset input of R-S flip flop 503.

The operation of the second circuit 502 is generally the same as that of the operation of 501 already described.

Figure 7:
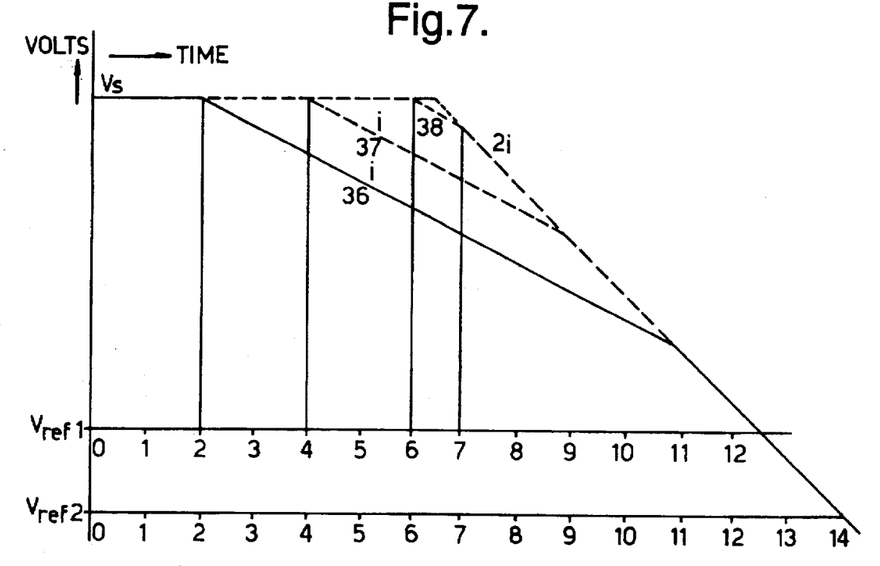
FIG. 7 shows the voltage waveforms of pulse generators of FIG. 5 at the different stations used in FIG. 3.

The operation of the clock distribution arrangement shown in FIG. 3 will now be described with respect to FIG. 7. For the sake of simplicity, it will be assumed that the path delay in both the forward and reverse directions between stations P, Q and R on path 32 are each equal to two units of time, that the path delay between the output of buffer 3 and the forward path terminal of station P is two units of time and that the delay between the forward and reverse path points of station R is one unit of time. FIG. 7 illustrates the preferred arrangement for the circuit of FIG. 6, where current sources 517, 518, 537 and 538 all produce identical currents, the values of capacitors 516 and 536 are substantially identical and the same reference voltage is applied to the non-inverting inputs of comparators 515 and 535. At time 0, the "rising edge" capacitor 516 in each of the pulse generators is charged to the supply voltage VS. At this instant of time a clock pulse issues from the buffer 3. After two time units, the pulse arrives at station P and is applied to the "forward terminal" of that station, thus opening switch 513 in pulse generator 36 and connecting current source 518 to discharge capacitor 516 at a first rate i. After a further two units of time the clock pulse reaches the second station 37 at the corresponding forward terminal. The capacitor 516 in pulse generator 37 likewise begins to discharge at a current of i. Finally after a further two units of time the clock pulse reaches station 38 and the capacitor 516 of that station accordingly begins to discharge.

However, after the clock pulse has traversed the end section of the path 32 it reaches the reverse terminal of pulse generator 38 one unit of time later, at which time the second current source 517 of that generator is made operative. At time point 7 the capacitor 516 of pulse generator 38 now begins to discharge at a rate of 2i. After a further delay of two time units the clock pulse reaches the reverse terminal of pulse generator 37 and the capacitor 516 of that pulse generator likewise begins to discharge at a rate 2i. Finally at two further time units later the reverse terminal of station 36 receives the clock pulse and the capacitor 516 of that generator also begins to discharge at a rate of 2i.

It will be seen from FIG. 7 that the voltages on each capacitor 516 follow the same characteristic from this point forward. Thus if the same reference voltage, for example $V_{ref1}$, is applied to each comparator 515, the pulse generators 36, 37 and 38 will produce a rising edge at the same instant of time, this instant being determined by the level of reference voltage selected. Referring once again to FIG. 7 it will be seen that the rising edge is produced at 12.5 units of time for a value of $V_{ref1}$ and at 14 units of time for a value of $V_{ref2}$. Careful inspection of FIG. 7 shows that the intersection of the final capacitor discharge characteristic and the line of the supply voltage is effectively the point at which the pulse passing along path 32 reaches the extremity 35. Furthermore the time of occurrence of the leading edge of the output pulse of each pulse generator for any given value of reference voltage $V_{ref}$ depends upon the instant at which the clock pulse was at the extremity 35. Clearly in selecting the value of reference voltage $V_{ref}$, care must be taken to ensure that this voltage is below the lowest value of capacitor voltage which would be achieved for the longest possible discharge time, based upon a supply voltage of VS. In other words for the example shown, the value of $V_{ref}$ must be lower than the voltage at which the capacitor 516 of pulse generator 36 begins to decay at a rate of 2i.

Figure 8:
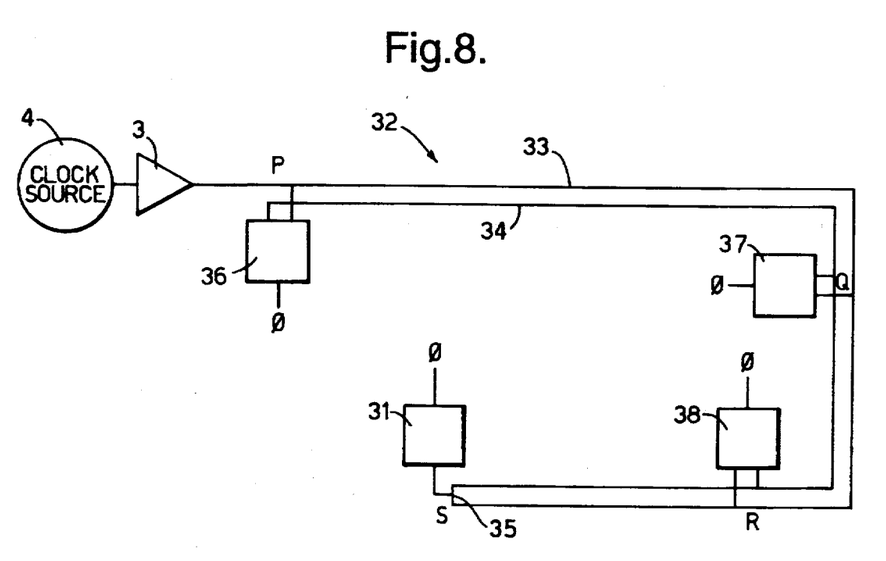
FIG. 8 shows a modification of the apparatus of FIG. 3.

Referring now to FIG. 8 there is shown a second embodiment of a clock distribution arrangement. This arrangement is substantially similar to that shown in FIG. 3 and likewise has a desired number of stations P, Q, R with however an additional station S located at the extremity 35 of the path 32. The pulse generator 31 for the station S only needs to have a single input. It can be arranged to produce an output clock pulse at a predetermined delay after receiving the pulse from path 32. This predetermined delay is selected to be the same as the interval C (see FIG. 4) whereby pulses are produced by each pulse generator substantially simultaneously.

A second embodiment of the pulse generator will now be described with reference to FIGS. 9 and 10.

Figure 9:
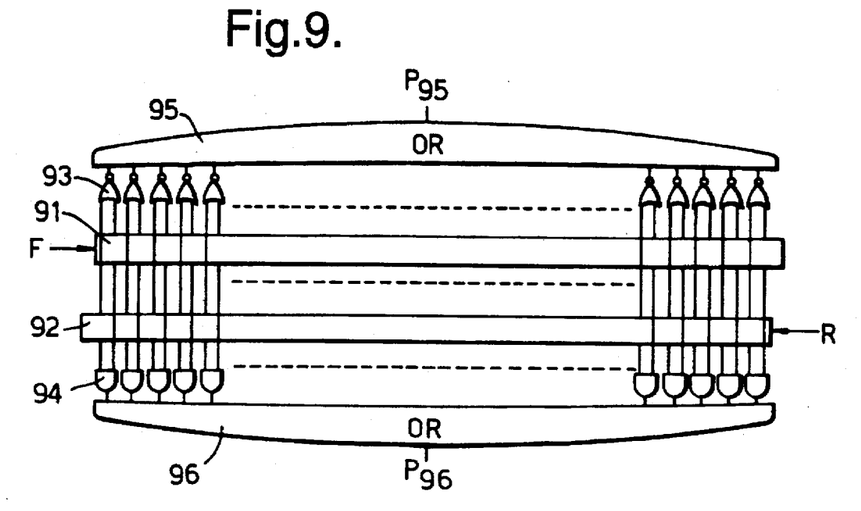
FIG. 9 shows a second embodiment of a pulse generator in accordance with the invention.

Referring to FIG. 9, the pulse generator consists of a first tapped delay device 91 and a second similar tapped delay device 92. The two delay devices are arranged electrically side-by-side, but with inputs at opposite ends. A plurality of first two-input gates 93, equal in number to the number of taps of each delay device, are connected between the delay devices, so that the first such gate Has one input connected to the first tap of the first delay device 91, and a second input connected to the last tap on delay device 94, and so on along both delay devices. As shown in FIG. 9 the logic gates 93 are NOR gates. The outputs of each of the first logic gates 93 are connected to respective inputs of an OR gate 95, having inputs equal in number to the number of first logic gates. The output of the first OR gate 95 provides an output pulse $P_{95}$.

A plurality of second two-input logic gates 94 is connected in similar fashion to the plurality of first logic gates 93. Each of the logic gates 94 is an AND gate and in similar fashion to the NOR gates 93, each AND gate has inputs connected across the delay devices 91 and 92. A second OR gate 96 has a like plurality of inputs, each connected to the output of one of the AND gates 94. The OR gate 96 produces an output pulse $P_{96}$. The input of the first delay device 91 is designated by reference sign F and the input to delay device 92 is designated by reference sign R.

It may be seen that each delay line has m taps and a similar number of logic gates are provided, wherein the nth logic gate has a first input connected to the nth tap of the first delay circuitry and a second input connected to the (m-n)th tap of the second delay circuitry.

Figure 10:
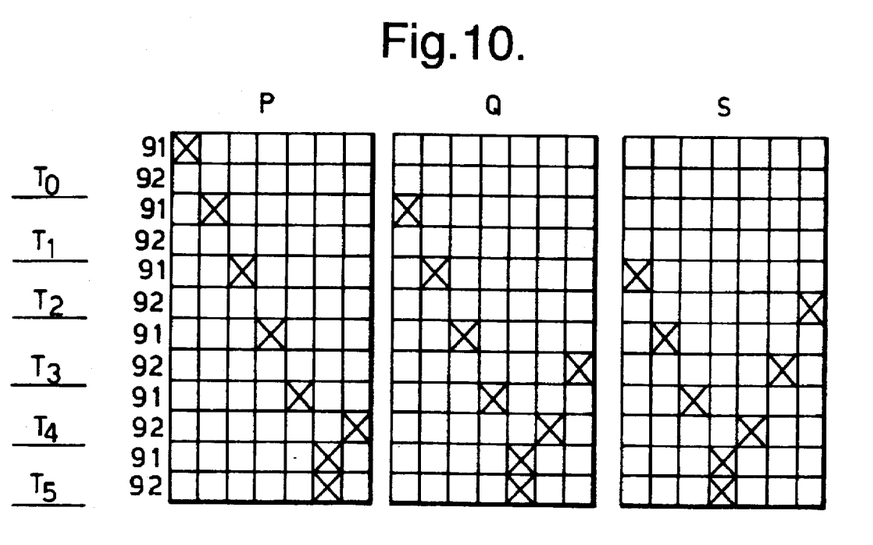
FIG. 10 is a time diagram showing the operation of pulse generators of FIG. 9 used in the apparatus of FIG. 8.

Referring now to FIGS. 8 and 10, the operation of the pulse generator shown in FIG. 9 will now be further explained.

FIG. 10 shows the progress of the forward and reverse pulses along the respective delay lines at each of the stations P, Q & S of FIG. 8, it being assumed for the sake of simplicity that each station is separated from the respective adjacent station(s) by the same path delay, shown in the FIG. 10 as the horizontal width of a square. Thus for station P the forward pulse appears at a time $T_0$ on delay device 91, which then conveys the pulse at a constant rate along the delay device until time $T_4$ where the reverse pulse appears at the input of the second delay device 92 by virtue of the path delay of the clock pulse path. The reverse pulse moves at the same speed along the delay line 92 but in the opposite direction so that at time $T_5$ the two pulses are coincident.

Referring now to FIG. 9 once again as the rising edges of two pulses appear at corresponding taps of both delay lines, the AND gate 94 coupled across those taps senses the appearance of a logical 1 at both inputs and produces a logical 1 at its output. As the pulses continue to propagate the NOR gates 93 sense the falling transition at the tap of concern from logical 1 to logical 0 and in response thereto produce a logical 1 output. Thus the rising edge is sensed by first OR gate 96 in the form of a pulse at output $P_{96}$, and the falling edge is sensed at second OR gate 95 producing a pulse at output $P_{95}$. The rising edge output is used to set a flip flop, as described with respect to FIG. 5, and the falling edge at output $P_{95}$ is used to reset the R-S flip flop.

Returning again to FIG. 10, inspection of the time diagram for station Q shows that the forward pulse appears at time $T_1$ and the reverse pulse at time $T_3$. However, operation of the circuit ensures that coincidence occurs at $T_5$ as the same for station P.

Finally it will be noted that the device of FIG. 9 also operates even where the two inputs of forward and reverse pulses occur at the same instant $T_2$, to produce a pulse at the time $T_5$.

Although this embodiment has been described for the case where the delay devices are similar, this is not essential to the invention. For example, the first delay device could have an untapped delay portion at the input end. The essential feature is that the forward and reverse pulses should appear at corresponding taps on the respective lines.

Figure 11:
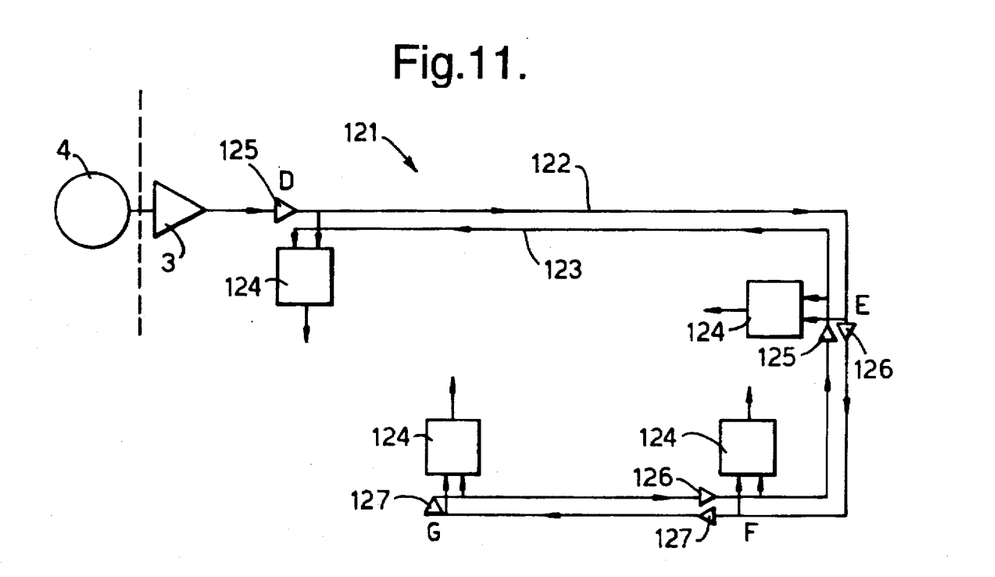
FIG. 11 is a modification of the FIG. 3 arrangement for an integrated circuit, using buffered lines.

Referring now to FIG. 11, there will be described a modification of the arrangement described with respect to FIG. 3 for use with lossy lines and especially for lines where RC delays tend to dominate. This is of special significance to integrated circuits, since in integrated circuits transmission line delays are usually relatively small. Consequentially, since RC delays are not linearly proportional to line length, it may be necessary to introduce buffers. The arrangement shown in FIG. 11 has a transmission path 121 which has a forward path portion 122 and a reverse path portion 123. Stations D, E, F and G are arranged along the path 121 and each station has an associated pulse generator 124 for producing a clock pulse at a predetermined time in relation to the application of a forward and a reverse pulse at the station of concern. To provide a correction for losses along the path, a first buffer 125 is inserted into the forward path portion 122 at station D. Since the buffer will itself tend to introduce some delay into the system a similar buffer 125 is inserted into the reverse path portion 123 at station E. Again to cope with losses a buffer 126 is inserted into the forward path portion at station E, with a corresponding reverse path portion buffer 126 at station F. Finally, a forward path portion buffer 127 is inserted at station F with a reverse path portion twin at station G.

Figure 12:
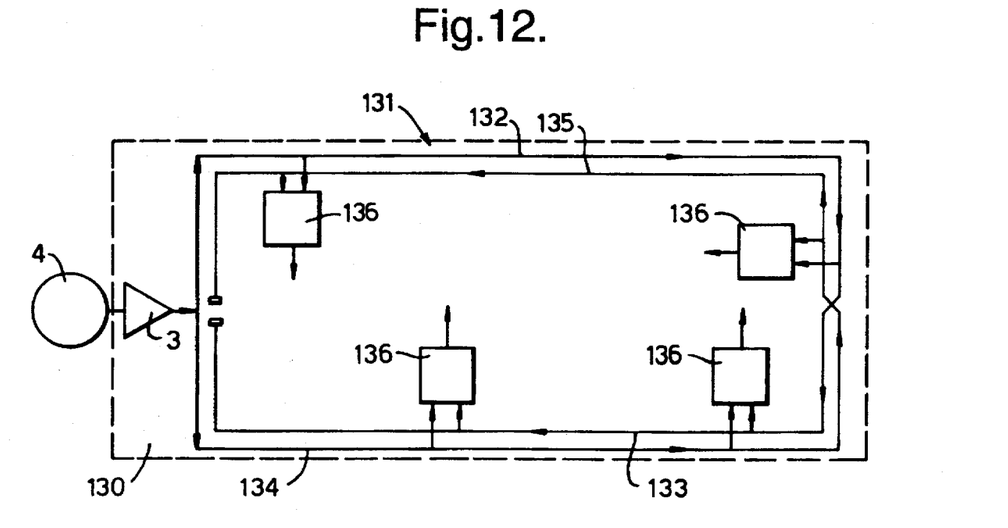
FIG. 12 is a further modification of the FIG. 3 arrangement.

Referring now to FIG. 12, an integrated circuit 130 has a clock pulse transmission path 131 which includes a first forward path portion 132 and a first reverse path portion 133 and a second forward path portion 134 with a second reverse path portion 135. As will be seen from the drawing, the clock path runs substantially around the perimeter of the integrated circuit 130 which may for example be a large VLSI chip. Associated with the clock path 131 are pulse generators 136 which provide simultaneous clock pulses at their respective outputs. There are number of advantages to providing simultaneous clocks around the parameter or pad ring of a large VLSI chip, two of which are that the input/output pads can be clocked, which allows fast synchronous communication with other devices, and that the clock buffers which normally require substantial power connections, are located next to the pad ring of the chip, which is a location where good power connections already exist.

Although the particular description relates to clock pulse generation and distribution, it will be appreciated that the invention is equally applicable to generation or distribution of other pulses.

The invention has now been described with respect to various embodiments thereof. It will of course be appreciated that many modifications are possible within the scope of the appended claims. The embodiments therefore are not to be taken as limitative.

We claim:

1. A pulse distribution circuit for controlling pulse transmission skew, said circuit comprising:
   a forward pulse transmission path;
   a return pulse transmission path;
   a pulse input connected to said forward pulse transmission path;
   at least two pulse receiving stations connected to said forward and return pulse transmission paths at spaced locations along said paths; and
   pulse generating circuitry at each of said stations, said pulse generating circuitry including
      a first input for receiving a pulse on said forward pulse transmission path,
      a second input for receiving a pulse on said return pulse transmission path, and
      output circuitry for generating an effective pulse at a required time for use at the respective station, said output circuitry being coupled to said first and second inputs and including delay circuitry operable in response to each of said first and second inputs to determine said required time by generating a time delay dependent on an aggregate of time delays from input at each of said first and second inputs corresponding to the same pulse in said distribution circuit.

2. The pulse distribution circuit of claim 1 wherein said delay circuitry is operable to generate a time delay which is the sum of time intervals between each of said first and second inputs and said required time.

3. The pulse distribution circuit of claim 1 wherein said delay circuitry includes capacitor circuitry arranges to provide said effective pulse on change of charge level from a first charge level to a second charge level, said delay circuitry further comprising:
   first charge varying circuitry operable in response to said first input to vary the charge level towards said second charge level; and
   second charge varying circuitry operable in response to said second input to assist said first charge varying circuitry in varying the charge level to said second charge level.

4. The pulse distribution circuit of claim 3 wherein each said charge varying circuit comprises a current source.

5. The pulse distribution circuit of claim 4 wherein each said current source is arranged to provide the same current value.

6. The pulse distribution circuit of claim 3 wherein said capacitor circuitry is connected to comparator circuitry having one input from said capacitor circuitry and one input connected to a reference voltage, whereby said required time is determined by a voltage at said one input reaching a predetermined relationship with said reference voltage.

7. The pulse distribution circuit of claim 1 wherein said pulse generating circuitry further comprises:
   first delay circuitry having said first input at one end thereof wherein a pulse from the forward pulse transmission path propagates along said first delay circuitry from said one end;
   second delay circuitry having a second input at an opposite end thereof whereby a pulse from said return transmission path propagates along said second delay circuitry from said opposite end,
   said first and second delay circuitry each having a plurality of taps distributed along the circuitry from the respective input; and
   logic circuitry having a plurality of first logic inputs connected to respective taps of the first delay circuitry, a plurality of second logic inputs connected to respective taps of the second delay circuitry, and an output to generate said effective pulse when pulses from said forward and return transmission paths corresponding to the same distributed pulse reach corresponding taps.

8. The pulse distribution circuit of claim 7 wherein said first and second delay circuitry each comprises a similar delay line having m taps and said logic circuitry has m gates, wherein the $n^{th}$ logic gate has a first input connected to the $n^{th}$ tap of the first delay circuitry and a second input connected to the $(m-n^{th})$ tap of the second delay circuitry.

9. A method of controlling pulse transmission skew in a pulse distribution circuit, comprising:
   supplying a distributed pulse along a forward transmission path and a return transmission path to at least two pulse receiving stations connected to said distribution circuit;
   receiving as a first input at each pulse receiving station a pulse on said forward pulse transmission path;
   receiving as a second input at each pulse receiving station a pulse on said return pulse transmission path; and
   generating an effective pulse at a required time for use at the respective pulse receiving station by generating a time delay dependent on an aggregate of time delays from input of each of said first and second inputs corresponding to the same pulse in said distribution circuit.

10. The method of claim 9 said step of generating an effective pulse further comprises generating a time delay which is the sum of time intervals between each of said first and second inputs and said required time.

11. The method of claim 9 said step of generating an effective pulse further comprises generating a time delay by changing charge level from a first charge level to a second charge level in capacitor circuitry, said charge level being varied towards said second charge level by first charge varying circuitry operable in response to said first input and in addition by second charge varying circuitry operable in response to said second input to assist said first charge varying circuitry in varying the charge level to said second charge level.

12. The method of claim 11 wherein said step of changing charge level further comprises varying said charge level in said capacitor circuitry by one current source in response to said first input and by a second current source in response to said second input.

13. The method of claim 12 wherein said step of varying said charge level further comprises providing the same current value by each said current source.

14. The method of claim 11 further comprising comparing an output of said capacitor circuitry with a reference voltage using comparator circuitry, said required time being determined by the comparator circuitry indicating a predetermined relationship between its inputs.

15. The method of claim 9 wherein said first input at each station is supplied to one end of first delay circuitry, wherein a pulse from said forward pulse transmission path propagates along said first delay circuitry from said one end, said second input is supplied to an opposite end, and signals from said first and second delay circuitries are connected through a plurality of taps to logic circuitry which generates an output to create said effective pulse when pulses from said forward and return transmission paths corresponding to the same distributed pulse reach corresponding taps.

* * * * *